United States Patent
Xu

(10) Patent No.: US 12,218,126 B2
(45) Date of Patent: Feb. 4, 2025

(54) ESD PROTECTION STRUCTURE, ESD PROTECTION CIRCUIT, AND CHIP

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 565 days.

(21) Appl. No.: 17/451,670

(22) Filed: Oct. 21, 2021

(65) Prior Publication Data

US 2023/0040542 A1    Feb. 9, 2023

Related U.S. Application Data

(63) Continuation of application No. PCT/CN2021/111532, filed on Aug. 9, 2021.

(51) Int. Cl.
*H01L 27/02* (2006.01)

(52) U.S. Cl.
CPC ...... *H01L 27/0262* (2013.01); *H01L 27/0255* (2013.01); *H01L 27/0292* (2013.01)

(58) Field of Classification Search
CPC ............. H01L 27/0262; H01L 27/0255; H01L 27/0292; H01L 27/02; H01L 27/0296; H02H 9/00
See application file for complete search history.

(56) References Cited

U.S. PATENT DOCUMENTS

| | | | |
|---|---|---|---|
| 6,353,237 B1 | 3/2002 | Yu | |
| 10,134,724 B2 | 11/2018 | Lee | |
| 11,342,323 B2* | 5/2022 | Salcedo | ................ H01L 29/402 |
| 2008/0002321 A1 | 1/2008 | Sorgeloos et al. | |
| 2015/0236011 A1 | 8/2015 | Wang et al. | |
| 2017/0179110 A1* | 6/2017 | Lee | ..................... H01L 29/7408 |

FOREIGN PATENT DOCUMENTS

| | | |
|---|---|---|
| CN | 106898606 A | 6/2017 |
| CN | 111092117 A | 5/2020 |
| KR | 20120068142 A | 6/2012 |

OTHER PUBLICATIONS

International Search Report cited in PCT/CN2021/111532 mailed Oct. 26, 2021, 10 pages.

* cited by examiner

*Primary Examiner* — Ermias T Woldegeorgis
(74) *Attorney, Agent, or Firm* — Syncoda LLC; Feng Ma

(57) ABSTRACT

The present disclosure provides an electrostatic discharge (ESD) protection structure, an ESD protection circuit, and a chip. The ESD protection structure includes a semiconductor substrate, a first N-type well, a first P-type well, a first N-type doped portion, a first P-type doped portion, a second N-type doped portion, and a second P-type doped portion. The semiconductor substrate includes a first integrated region. The first N-type well is located in the first integrated region. The first P-type well is located in the first integrated region. The first N-type doped portion is located in the first N-type well. The first P-type doped portion is located in the first N-type well. The second N-type doped portion is located in the first P-type well. The second P-type doped portion is located on a side of the second N-type doped portion away from the first N-type well.

12 Claims, 11 Drawing Sheets

ESD PROTECTION STRUCTURE, ESD PROTECTION CIRCUIT, AND CHIP

CROSS-REFERENCE TO RELATED APPLICATIONS

This is a continuation of International Patent Application No. PCT/CN2021/111532, filed on Aug. 9, 2021, which claims the priority to Chinese Patent Application No. 202011538427.9, titled "ESD PROTECTION STRUCTURE, ESD PROTECTION CIRCUIT, AND CHIP" and filed on Dec. 23, 2020. The entire contents of International Patent Application No. PCT/CN2021/111532 and Chinese Patent Application No. 202011538427.9 are incorporated herein by reference.

TECHNICAL FIELD

The present disclosure relates to the technical field of semiconductors, and in particular, to an electrostatic discharge (ESD) protection structure, an ESD protection circuit, and a chip.

BACKGROUND

An electrostatic discharge (ESD) protection circuit is generally required in a chip. The ESD protection circuit is used to discharge static electricity in the chip, to avoid damage to a core circuit in the chip under action of the static electricity.

In the related art, commonly used ESD protection structures include MOS transistors, diodes, thyristors, and other components. However, the ESD protection structure in the related art has a high trigger voltage, that is, the ESD protection structure in the related art cannot be triggered in a timely manner at a low electrostatic voltage to discharge the static electricity.

It should be noted that information disclosed in the above background section is used merely for a better understanding of the background of the present disclosure, and therefore may include information that does not constitute the prior art known to those of ordinary skill in the art.

SUMMARY

According to one aspect of the present disclosure, an ESD protection structure is provided, where the ESD protection structure includes: a semiconductor substrate, a first N-type well, a first P-type well, a first N-type doped portion, a first P-type doped portion, a second N-type doped portion, and a second P-type doped portion. The semiconductor substrate includes a first integrated region. The first N-type well is located in the first integrated region. The first P-type well is located in the first integrated region, and arranged adjacent to the first N-type well. The first N-type doped portion is located in the first N-type well. The first P-type doped portion is located in the first N-type well, and located on a side of the first N-type doped portion close to the first P-type well. The second N-type doped portion is located in the first P-type well. The second P-type doped portion is located on a side of the second N-type doped portion away from the first N-type well. The first N-type doped portion is electrically connected to the second P-type doped portion.

According to one aspect of the present disclosure, an ESD protection circuit is provided, where the ESD protection circuit includes at least one ESD protection unit, and the ESD protection unit includes a thyristor, a first diode, and a second diode. The thyristor includes a PNP-type triode and an NPN-type triode. The PNP-type triode has an emitter forming an anode of the thyristor, a base being connected to a first node, and a collector being connected to a second node. The NPN-type triode has a collector being connected to the first node, a base being connected to the first node and the second node, and an emitter forming a cathode of the thyristor. The anode of the first diode is connected to the anode of the thyristor, and the cathode of the first diode is connected to the first node. The anode of the second diode is connected to the first node, and the cathode of the second diode is connected to the cathode of the thyristor.

According to one aspect of the present disclosure, a chip is provided, where the chip includes the ESD protection structure described above.

According to one aspect of the present disclosure, a chip is provided, where the chip includes the ESD protection circuit described above.

It should be understood that the above general description and the following detailed description are only exemplary and explanatory, and should not be construed as a limitation to the present disclosure.

BRIEF DESCRIPTION OF THE DRAWINGS

The accompanying drawings, which are incorporated into and constitute a part of the description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
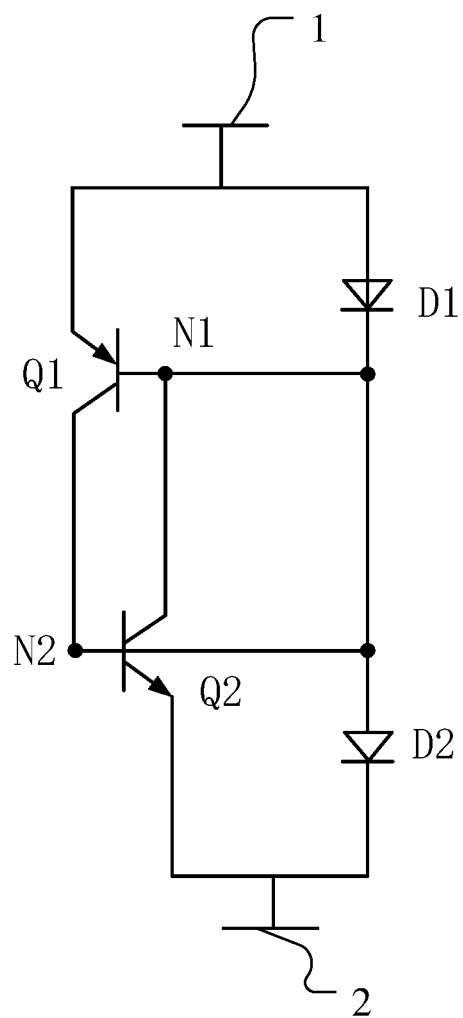
FIG. 1 is a schematic structural diagram of an exemplary embodiment of an ESD protection circuit according to the present disclosure.

Exemplary embodiments will be described below in further detail with reference to the accompanying drawings. However, the exemplary embodiments can be implemented in a plurality of forms and should not be construed as being limited to examples described herein. On the contrary, these embodiments are provided such that the present disclosure is more comprehensive and complete, and fully conveys the concept of the exemplary embodiments to persons skilled in the art. The same reference numerals in the figures indicate the same or similar structures, and thus their detailed descriptions will be omitted. Although relative terms such as "upper" and "lower" are used in this specification to describe the relative relationship of one component of an icon to another, these terms are used in this specification only for convenience, for example, according to the orientation of the examples described in the accompanying drawings. It can be understood that if the device of the icon is turned upside down, the components described as "upper" will become the "lower" components. Other relative terms such as "high", "low", "top", "bottom", "left", "right", and the like also have similar meanings. When a structure is "on" other structures, it may mean that the structure is integrally formed on other structures, or that the structure is "directly" disposed on other structures, or that the structure is "indirectly" disposed on other structures through another structure.

The terms "one", "a", "the" are used to indicate the presence of one or more elements/components/and the like; the terms "includes" and "has" are used to indicate an open-ended inclusion and to mean that additional elements/components/and the like may exist in addition to the listed elements/components/and the like.

This exemplary embodiment provides an ESD protection circuit. FIG. 1 is a schematic structural diagram of an exemplary embodiment of an ESD protection circuit according to the present disclosure. The ESD protection circuit may include at least one ESD protection unit. As shown in FIG. 1, the ESD protection unit may include a thyristor, a first diode D1, and a second diode D2. The thyristor may include a PNP-type triode Q1 and an NPN-type triode Q2. The PNP-type triode Q1 has an emitter forming an anode 1 of the thyristor, a base being connected to a first node N1, and a collector being connected to a second node N2. The NPN-type triode Q2 has a collector being connected to the first node N1, a base being connected to the first node N1 and the second node N2, and an emitter forming a cathode 2 of the thyristor. The anode of the first diode D1 is connected to the anode 1 of the thyristor, and the cathode of the first diode D1 is connected to the first node N1. The anode of the second diode D2 is connected to the first node N1, and the cathode of the second diode D2 is connected to the cathode 2 of the thyristor.

In the ESD protection circuit provided in this exemplary embodiment, the anode 1 may be connected to a first signal terminal, and the cathode may be connected to a second signal terminal. When there is static electricity on the first signal terminal and a potential difference between the first signal terminal and the second signal terminal is greater than a threshold, the first diode D1 and the second diode D2 may be turned on first. Due to a pressure drop of the first diode D1, a potential difference is generated between the anode 1 and the first node N1, and under action of the potential difference between the anode 1 and the first node N1, the PNP-type triode Q1 is turned on. In addition, due to a pressure drop of the second diode D2, a potential difference is generated between the first node N1 and the cathode 2, and under action of the potential difference between the first node N1 and the cathode 2, the NPN-type triode Q2 is turned on. The turned-on NPN-type triode Q2 and the turned-on PNP-type triode Q1 form a positive feedback circuit, such that the ESD protection circuit can quickly discharge the static electricity on the first signal terminal to the second signal terminal. After the diode in the ESD protection circuit is turned on first, the thyristor can be triggered, and a high current quickly passes through the thyristor, such that the static electricity can be quickly discharged. A trigger voltage is small because an on-state voltage required for the diode to be turned on first is low.

In this exemplary embodiment, the anode of the thyristor in the ESD protection circuit forms an anode of the ESD protection unit, and the cathode of the thyristor in the ESD protection circuit forms a cathode of the ESD protection unit. The ESD protection circuit may include a plurality of ESD protection units, the plurality of ESD protection units are connected in series, and in two adjacent ESD protection units, an anode of one ESD protection unit is connected to a cathode of the other ESD protection unit. The plurality of ESD protection units connected in series can increase a maintenance voltage of the ESD protection circuit. When the maintenance voltage of the ESD protection circuit is greater than a supply voltage of a protected circuit, the ESD protection circuit does not latch.

Figure 2:
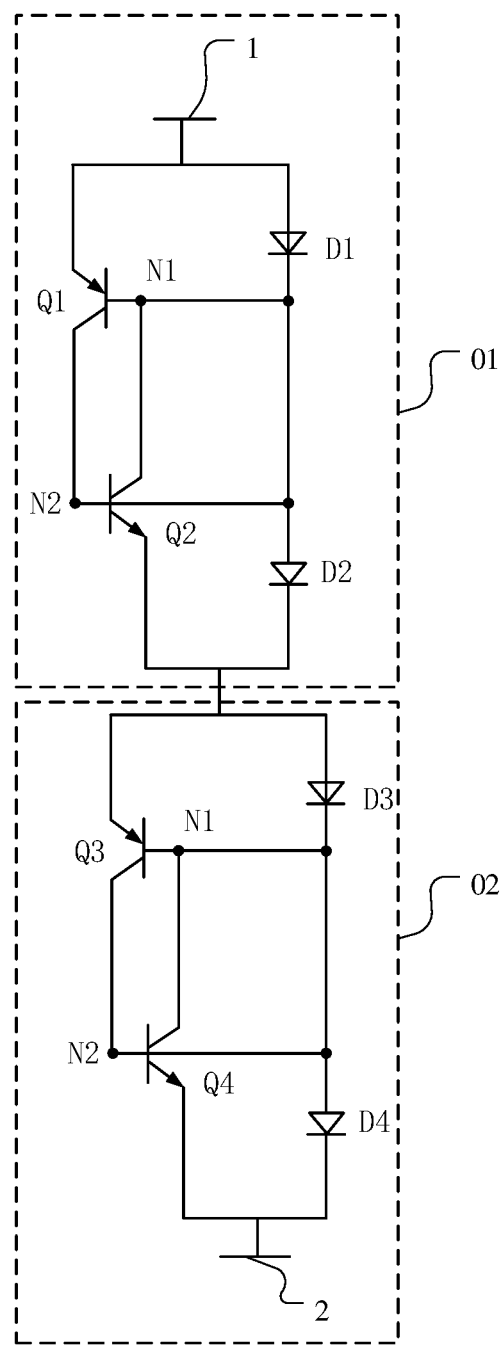
FIG. 2 is a schematic structural diagram of another exemplary embodiment of an ESD protection circuit according to the present disclosure.

FIG. 2 is a schematic structural diagram of another exemplary embodiment of an ESD protection circuit according to the present disclosure. The ESD protection circuit includes two ESD protection units 01 and 02. A cathode of the ESD protection unit 01 may be connected to an anode of the ESD protection unit 02. An anode of the ESD protection unit 01 may be configured to form an anode 1 of the ESD protection circuit. A cathode of the ESD protection unit 02 may be configured to form a cathode 2 of the ESD protection circuit. The an anode 1 of the ESD protection circuit may be connected to a first signal terminal. The cathode 2 of the ESD protection circuit may be connected to a second signal terminal. The ESD protection circuit may be configured to discharge static electricity on the first signal terminal to the second signal terminal.

Figure 3:
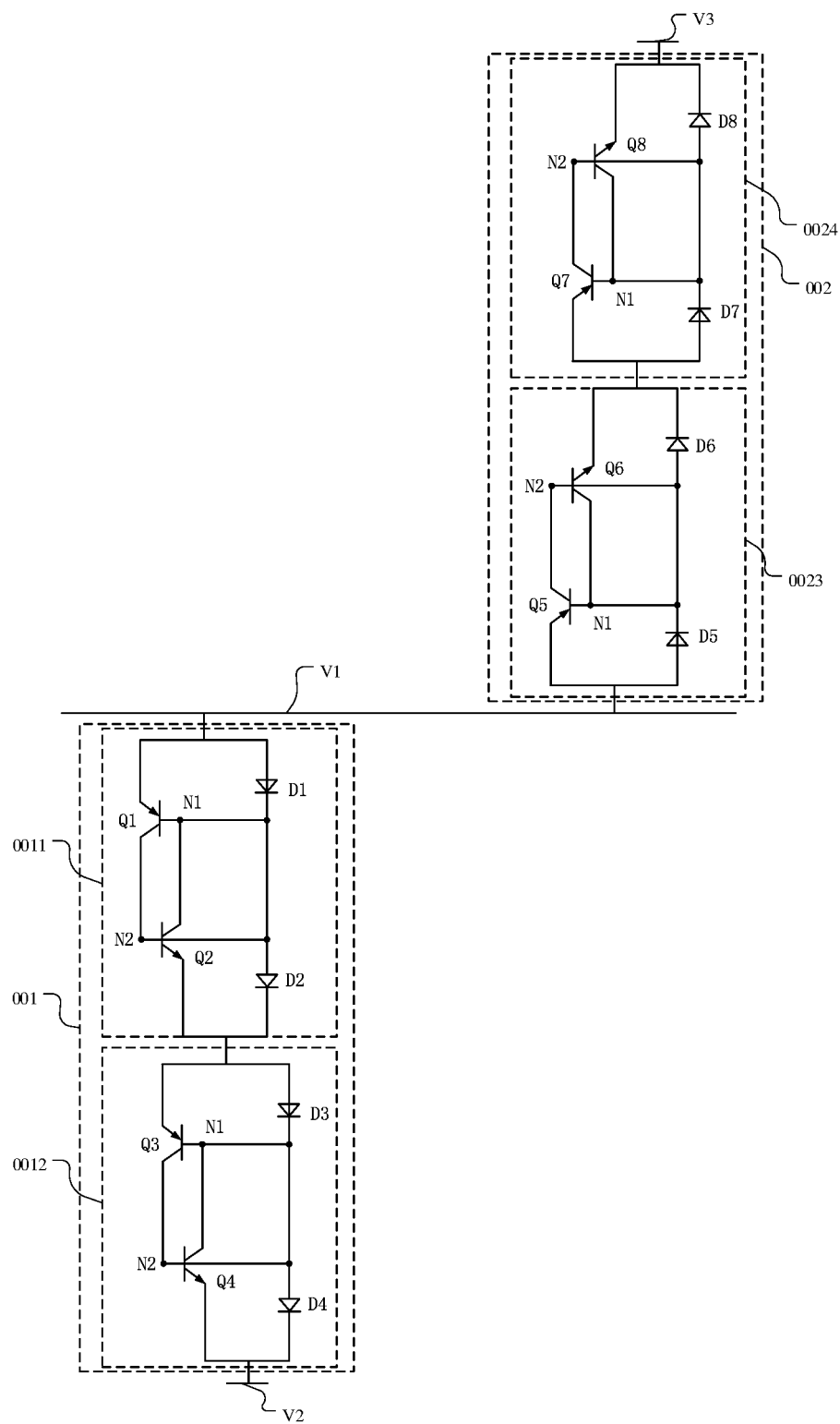
FIG. 3 is a schematic structural diagram of another exemplary embodiment of an ESD protection structure according to the present disclosure.

FIG. 3 is a schematic structural diagram of another exemplary embodiment of an ESD protection structure according to the present disclosure. The ESD protection circuit may include a first ESD protection unit group 001, a second ESD protection unit group 002, a first signal terminal V1, a second signal terminal V2, and a third signal terminal V3. The first ESD protection unit group 001 may include a first ESD protection unit 0011 and a second ESD protection unit 0012. An anode of the first ESD protection unit 0011 is connected to the first signal terminal V1. An anode of the second ESD protection unit 0012 is connected to a cathode of the first ESD protection unit 0011, and a cathode of the second ESD protection unit 0012 is connected to the second signal terminal V2. The second ESD protection unit group 002 may include a third ESD protection unit 0023 and a fourth ESD protection unit 0024. An anode of the third ESD protection unit 0023 is connected to the first signal terminal V1. An anode of the fourth ESD protection unit 0024 is connected to a cathode of the third ESD protection unit

0023, and a cathode of the fourth ESD protection unit 0024 is connected to the third signal terminal V3. The first ESD protection unit, the second ESD protection unit, the third ESD protection unit, and the fourth ESD protection unit may have a same structure as the ESD protection units described above. The ESD protection circuit shown in FIG. 3 may discharge static electricity on the first signal terminal V1 to the second signal terminal V2 and/or the third signal terminal V3. The ESD protection circuit may be applied to a chip. The chip may include a signal transmission terminal, a power terminal, and a ground terminal. The first signal terminal of the ESD protection circuit may be connected to the power terminal, the second signal terminal is connected to the signal transmission terminal, and the third signal terminal is connected to the ground terminal. Alternatively, the first signal terminal of the ESD protection circuit may be connected to the signal transmission terminal, the second signal terminal is connected to the ground terminal, and the third signal terminal is connected to the power terminal. Alternatively, the first signal terminal of the ESD protection circuit may be connected to the ground terminal, the second signal terminal is connected to the signal transmission terminal, and the third signal terminal is connected to the power terminal. The signal transmission terminal may be a signal output terminal or a signal input terminal.

Figure 4:
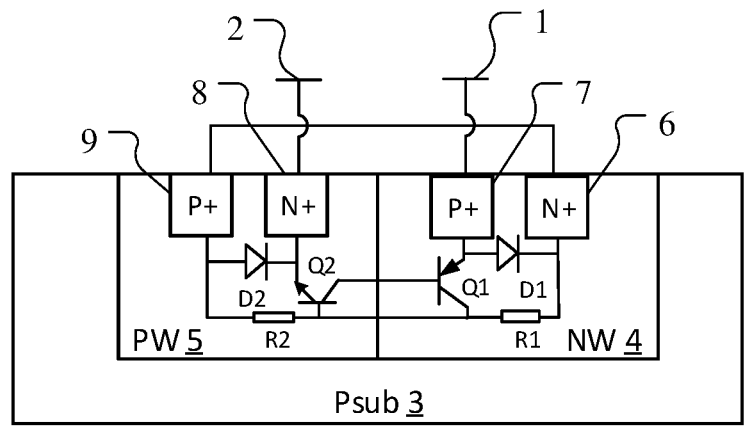
FIG. 4 is a schematic structural diagram of an exemplary embodiment of an ESD protection structure according to the present disclosure.

This exemplary embodiment further provides an ESD protection structure. FIG. 4 is a schematic structural diagram of an exemplary embodiment of an ESD protection structure according to the present disclosure. The ESD protection structure may include a semiconductor substrate 3, a first N-type well 4, a first P-type well 5, a first N-type doped portion 6, a first P-type doped portion 7, a second N-type doped portion 8, and a second P-type doped portion 9. The semiconductor substrate 3 may include a first integrated region. The first N-type well 4 may be located in the first integrated region. The first P-type well 5 may be located in the first integrated region, and arranged adjacent to the first N-type well 4. The first N-type doped portion 6 may be located in the first N-type well 4. The first P-type doped portion 7 may be located in the first N-type well 4, and located on a side of the first N-type doped portion 6 close to the first P-type well 5. The second N-type doped portion 8 may be located in the first P-type well 5. The second P-type doped portion 9 may be located in the first P-type well 5, and located on a side of the second N-type doped portion 8 away from the first N-type well 4. The first N-type doped portion 6 is electrically connected to the second P-type doped portion 9. The first P-type doped portion 7 and the first N-type doped portion 6 may be arranged at interval. The second P-type doped portion 9 and the second N-type doped portion 8 may be arranged at interval. A doping concentration of a doped well (for example, the first P-type well or the first N-type well) may be less than that of a doped portion (for example, the first N-type doped portion or the first P-type doped portion). The semiconductor substrate may be a P-type semiconductor substrate.

As shown in FIG. 4, the ESD protection structure may form the ESD protection circuit shown in FIG. 1. The first P-type doped portion 7 may form the emitter of the PNP-type triode Q1. The first N-type well 4 may form the base of the PNP-type triode Q1. The first P-type well 5 may form the collector of the PNP-type triode Q1. The second N-type doped portion 8 may form the emitter of the NPN-type triode Q2. The first P-type well 5 may form the base of the NPN-type triode Q2. The first N-type well 4 may form the collector of the NPN-type triode Q2. The first N-type well 4 and the first P-type doped portion 7 may form the first diode D1. The first P-type well 5 and the second N-type doped portion 8 may form the second diode D2.

Figure 5:
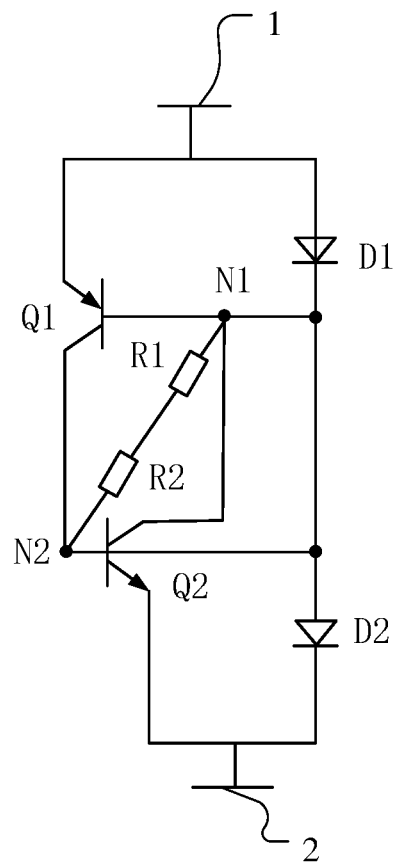
FIG. 5 is a schematic structural diagram of another exemplary embodiment of an ESD protection circuit according to the present disclosure.

In addition, as shown in FIG. 4, the first N-type well 4 may further have a resistor R1, and the first P-type well 5 may further have a resistor R2. Correspondingly, FIG. 5 is a schematic structural diagram of another exemplary embodiment of an ESD protection circuit according to the present disclosure. Considering the resistors of the first N-type well 4 and the first P-type well 5, the ESD protection circuit corresponding to the ESD protection structure shown in FIG. 4 may be further shown in FIG. 5. The ESD protection circuit shown in FIG. 5 has a same working principle and technical effect as the ESD protection structure shown in FIG. 1.

Figure 6:
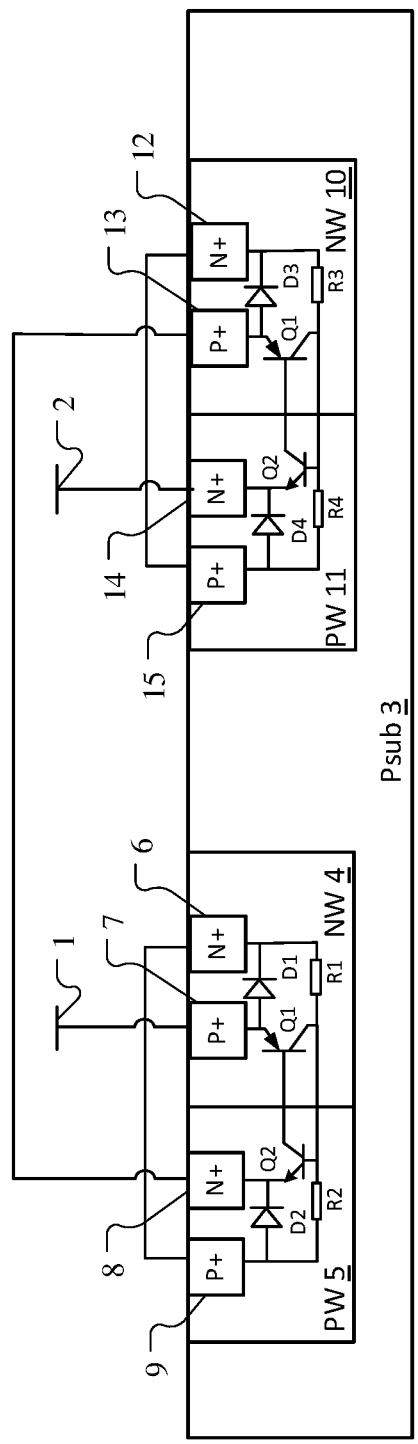
FIG. 6 is a schematic structural diagram of another exemplary embodiment of an ESD protection structure according to the present disclosure.

In this exemplary embodiment, FIG. 6 is a schematic structural diagram of another exemplary embodiment of an ESD protection structure according to the present disclosure. The semiconductor substrate may further include a second integrated region. The first integrated region and the second integrated region are arranged at interval. The ESD protection structure may further include a second N-type well 10, a second P-type well 11, a third N-type doped portion 12, a third P-type doped portion 13, a fourth N-type doped portion 14, and a fourth P-type doped portion 15.

The second N-type well 10 is located in the second integrated region. The second P-type well 11 is located in the second integrated region, and arranged adjacent to the second N-type well 10. The third N-type doped portion 12 is located in the second N-type well 10. The third P-type doped portion 13 is located in the second N-type well 10, and located on a side of the third N-type doped portion 12 close to the second P-type well 11. The fourth N-type doped portion 14 is located in the second P-type well 11. The fourth P-type doped portion 15 is located in the second P-type well 11, and located on a side of the fourth N-type doped portion 14 away from the second N-type well 10. The third N-type doped portion 12 is electrically connected to the fourth P-type doped portion 15. The second N-type doped portion 8 is electrically connected to the third P-type doped portion 13. A doping concentration of a doped well may be less than that of a doped portion. The fourth N-type doped portion 14 and the fourth P-type doped portion 15 are arranged at interval. The third N-type doped portion 12 and the third P-type doped portion 13 are arranged at interval.

As shown in FIG. 6, the ESD protection structure may form the ESD protection circuit shown in FIG. 2. The first P-type well 5, the first N-type well 4, the first N-type doped portion 6, the first P-type doped portion 7, the second N-type doped portion 8, and the second P-type doped portion 9 in the first integrated region may form the ESD protection unit 01 in FIG. 2. The second N-type well 10, the second P-type well 11, the third N-type doped portion 12, the third P-type doped portion 13, the fourth N-type doped portion 14, and the fourth P-type doped portion 15 may form the ESD protection unit 02 in FIG. 2. A manner in which the ESD protection structure shown in FIG. 6 forms the ESD protection circuit has been described in detail in the above content, and details are not described herein again.

Figure 7:
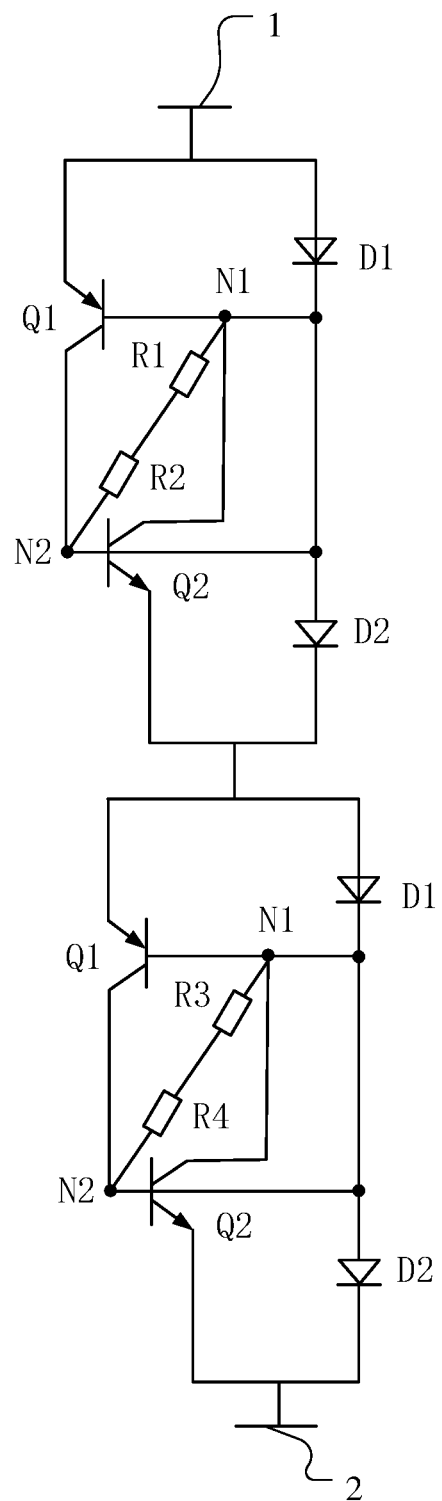
FIG. 7 is a schematic structural diagram of another exemplary embodiment of an ESD protection circuit according to the present disclosure.

In addition, as shown in FIG. 6, the second N-type well 10 may further have a resistor R3, and the second P-type well 11 may further have a resistor R4. Correspondingly, FIG. 7 is a schematic structural diagram of another exemplary embodiment of an ESD protection circuit according to the present disclosure. Considering the resistors of the second N-type well 10 and the second P-type well 11, the ESD protection circuit corresponding to the ESD protection structure shown in FIG. 6 may be further shown in FIG. 7.

The ESD protection circuit shown in FIG. 7 has a same working principle and technical effect as the ESD protection structure shown in FIG. 2.

Figure 8:
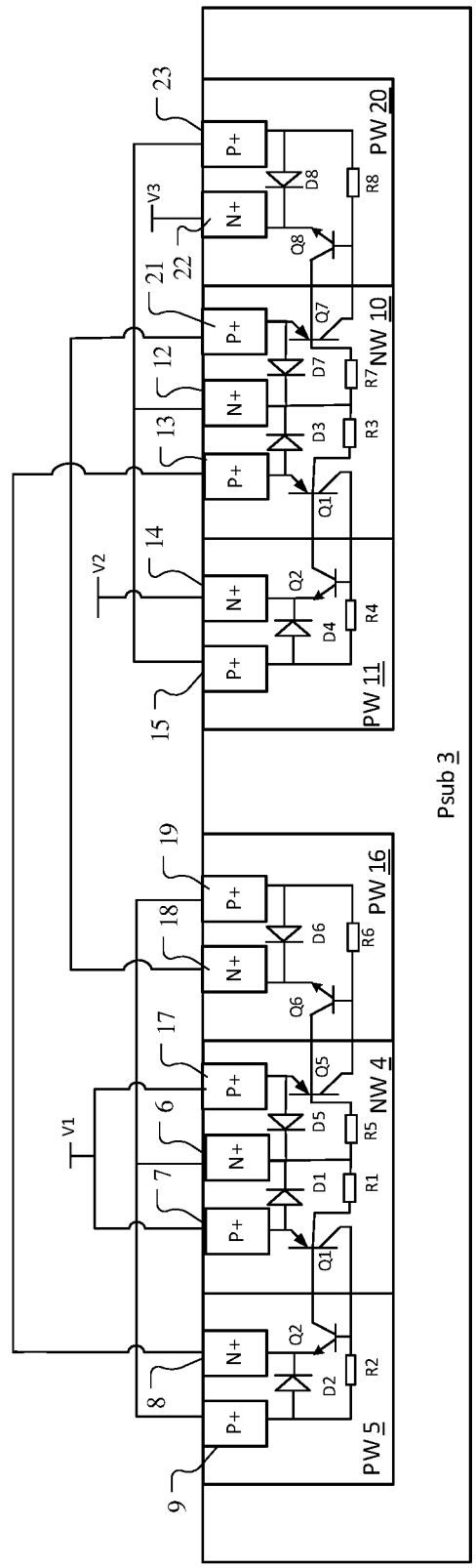
FIG. 8 is a schematic structural diagram of another exemplary embodiment of an ESD protection structure according to the present disclosure.

In this exemplary embodiment, FIG. 8 is a schematic structural diagram of another exemplary embodiment of an ESD protection structure according to the present disclosure. The ESD protection structure may further include a third P-type well 16, a fifth P-type doped portion 17, a fifth N-type doped portion 18, a sixth P-type doped portion 19, a fourth P-type well 20, a seventh P-type doped portion 21, a sixth N-type doped portion 22, and an eighth P-type doped portion 23. The third P-type well 16 is located in the first integrated region, and located on a side of the first N-type well 4 away from the first P-type well 5. The third P-type well 16 is arranged adjacent to the first N-type well 4. The fifth P-type doped portion 17 is located in the first N-type well 4, and located on a side of the first N-type doped portion 6 away from the first P-type doped portion 7. The fifth N-type doped portion 18 is located in the third P-type well 16, and located on a side of the fifth P-type doped portion 17 away from the first N-type doped portion 6. The sixth P-type doped portion 19 is located in the third P-type well 16, and located on a side of the fifth N-type doped portion 18 away from the first N-type well 4. The first N-type doped portion 6 is electrically connected to the sixth P-type doped portion 19. The fourth P-type well 20 is located in the second integrated region, and located on a side of the second N-type well 10 away from the second P-type well 11. The fourth P-type well 20 is arranged adjacent to the second N-type well 10. The seventh P-type doped portion 21 is located in the second N-type well 10, and located on a side of the third N-type doped portion 12 away from the third P-type doped portion 13. The sixth N-type doped portion 22 is located in the fourth P-type well 20, and located on a side of the seventh P-type doped portion 21 away from the third N-type doped portion 12. The eighth P-type doped portion 23 is located in the fourth P-type well 20, and located on a side of the sixth N-type doped portion 22 away from the second N-type well 10. The third N-type doped portion 12 is electrically connected to the eighth P-type doped portion 23. The fifth N-type doped portion 18 is electrically connected to the seventh P-type doped portion 21. A doping concentration of a doped well may be less than that of a doped portion. The fifth P-type doped portion 17 and the first N-type doped portion 6 are arranged at interval. The fifth N-type doped portion 18 and the sixth P-type doped portion 19 are arranged at interval. The seventh P-type doped portion 21 and the third N-type doped portion 12 are arranged at interval. The sixth N-type doped portion 22 and the eighth P-type doped portion 23 are arranged at interval.

As shown in FIG. 8, the fifth P-type doped portion 17 and the first N-type well 4 form a diode D5, the fifth P-type doped portion 17 forms an emitter of a PNP-type triode Q5, the first N-type well 4 forms a base of the PNP-type triode Q5, and the third P-type well 16 forms a collector of the PNP-type triode Q5. The fifth N-type doped portion 18 and the third P-type well 16 form a diode D6. The fifth N-type doped portion 18 forms an emitter of an NPN-type triode Q6. The third P-type well 16 forms a base of the NPN-type triode Q6. The first N-type well 4 forms a collector of the NPN-type triode Q6. The seventh P-type doped portion 21 and the second N-type well 10 form a diode D7. The seventh P-type doped portion 21 forms an emitter of a PNP-type triode Q7.

The second N-type well forms a base of the PNP-type triode Q7. The third P-type well 16 forms a collector of the PNP-type triode Q7. The sixth N-type doped portion 22 and the third P-type well 16 form a diode D8. The sixth N-type doped portion 22 forms an emitter of an NPN-type triode Q8. The third P-type well 16 forms a base of the NPN-type triode Q8. The second N-type well 10 forms a collector of the NPN-type triode Q8. The ESD protection structure may further include a first signal terminal V1, a second signal terminal V2, and a third signal terminal V3. The first P-type doped portion 7 and the fifth P-type doped portion 17 may be configured to connect to the first signal terminal V1 of the ESD protection structure. The fourth N-type doped portion 14 may be configured to connect to the second signal terminal V2 of the ESD protection structure. The sixth N-type doped portion 22 may be configured to connect to the third signal terminal V3 of the ESD protection structure. The ESD protection structure not only has a small trigger voltage, a high trigger speed, and a high maintenance voltage, but also has a small area and a low capacitance. In addition, the diodes connected in series can reduce a leakage current during normal operation of the chip.

The ESD protection structure may be applied to a chip. The chip may include a signal transmission terminal, a power terminal, and a ground terminal. The first signal terminal of the ESD protection structure may be connected to the power terminal, the second signal terminal is connected to the signal transmission terminal, and the third signal terminal is connected to the ground terminal. Alternatively, the first signal terminal of the ESD protection structure may be connected to the signal transmission terminal, the second signal terminal is connected to the ground terminal, and the third signal terminal is connected to the power terminal. Alternatively, the first signal terminal of the ESD protection structure may be connected to the ground terminal, the second signal terminal is connected to the signal transmission terminal, and the third signal terminal is connected to the power terminal. The signal transmission terminal may be a signal output terminal or a signal input terminal.

Figure 9:
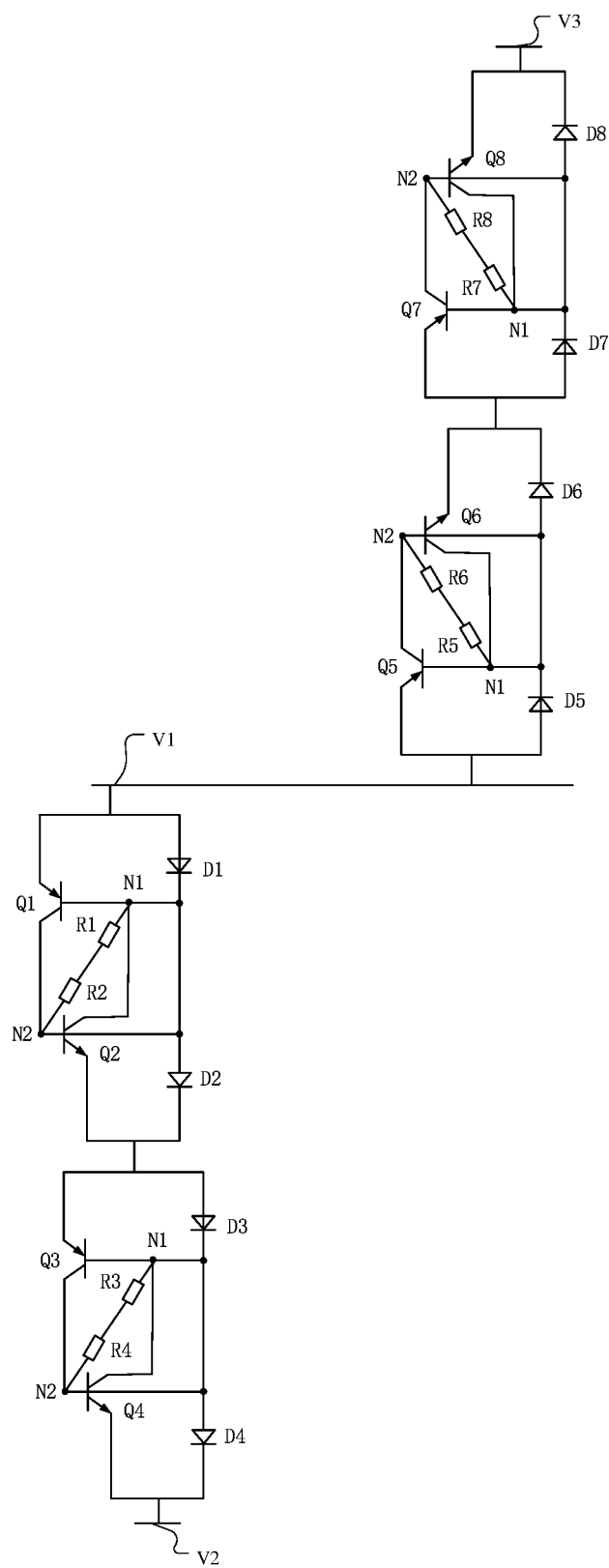
FIG. 9 is a schematic structural diagram of another exemplary embodiment of an ESD protection circuit according to the present disclosure.

In addition, as shown in FIG. 8, the first N-type well 4 may further have a resistor R5, the third P-type well 16 may further have a resistor R6, the second N-type well 10 may further have a resistor R7, and the third P-type well 16 may further have a resistor R8. Correspondingly, FIG. 9 is a schematic structural diagram of another exemplary embodiment of an ESD protection circuit according to the present disclosure. Considering the resistors of the doped wells, the ESD protection circuit corresponding to the ESD protection structure shown in FIG. 8 may be further shown in FIG. 9. The ESD protection circuit shown in FIG. 9 has a same working principle and technical effect as the ESD protection structure shown in FIG. 3.

Figure 10:
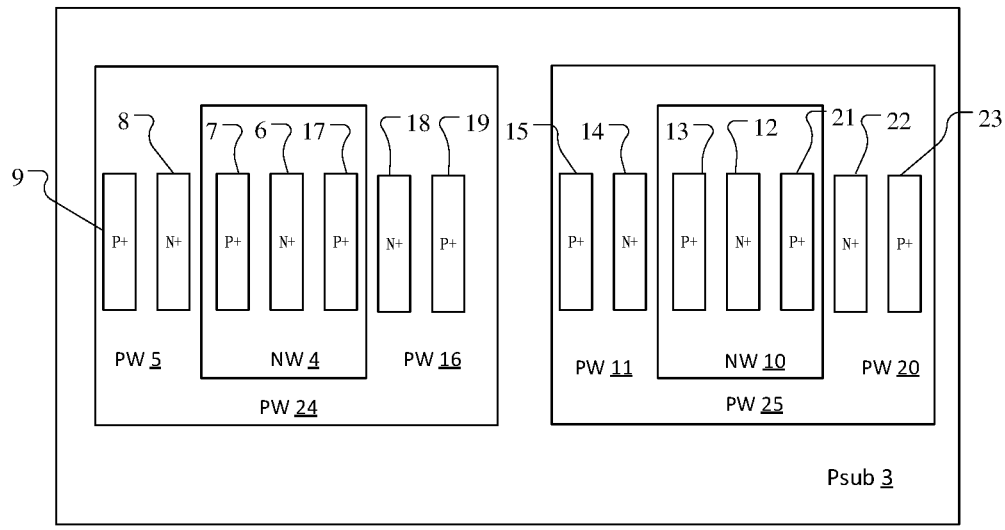
FIG. 10 is a top view of the ESD protection structure in FIG. 8.

FIG. 10 is a top view of the ESD protection structure in FIG. 8. The first N-type well 4 may be formed in an annular P-type well 24. A part of the P-type well 24 may form the first P-type well 5, and a part of the P-type well 24 may form the third P-type well 16. The second N-type well 10 may be formed in an annular P-type well 25. A part of the P-type well 25 may form the second P-type well 11, and a part of the P-type well 25 may form the fourth P-type well 20.

Figure 11:
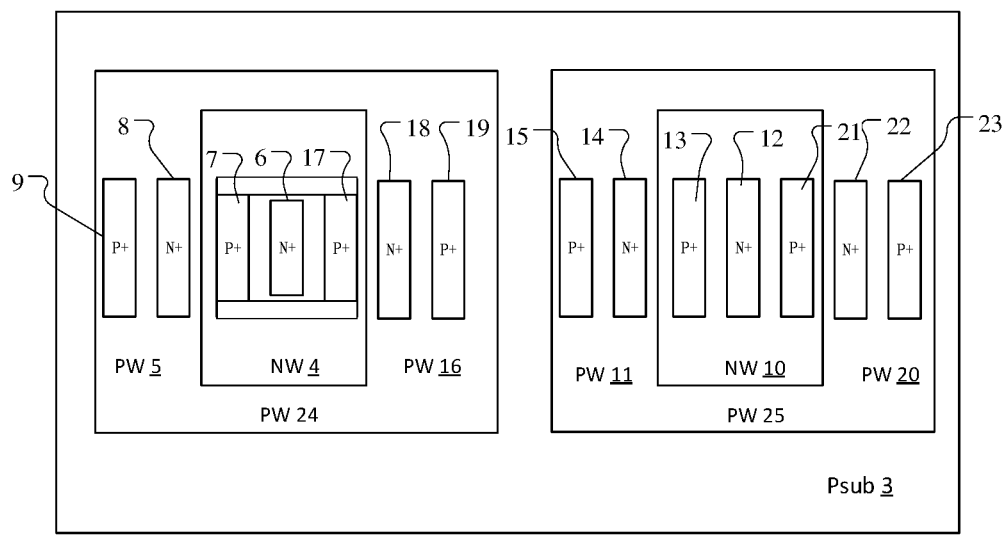
FIG. 11 is a top view of another exemplary embodiment of an ESD protection structure according to the present disclosure.

FIG. 11 is a top view of another exemplary embodiment of an ESD protection structure according to the present disclosure. The first P-type doped portion 7 and the fifth P-type doped portion 17 may form an annular doped portion surrounding the first N-type doped portion 6 with other P-type doped portions. The annular doped portion can increase effective areas of the bases of the triodes Q1 and Q5, while increasing diffusion coefficients of the first P-type doped portion 7 and the fifth P-type doped portion 17 serving as emitters, thereby raising the maintenance voltage of the ESD protection structure through the impact of current amplification coefficients of the triodes.

Figure 12:
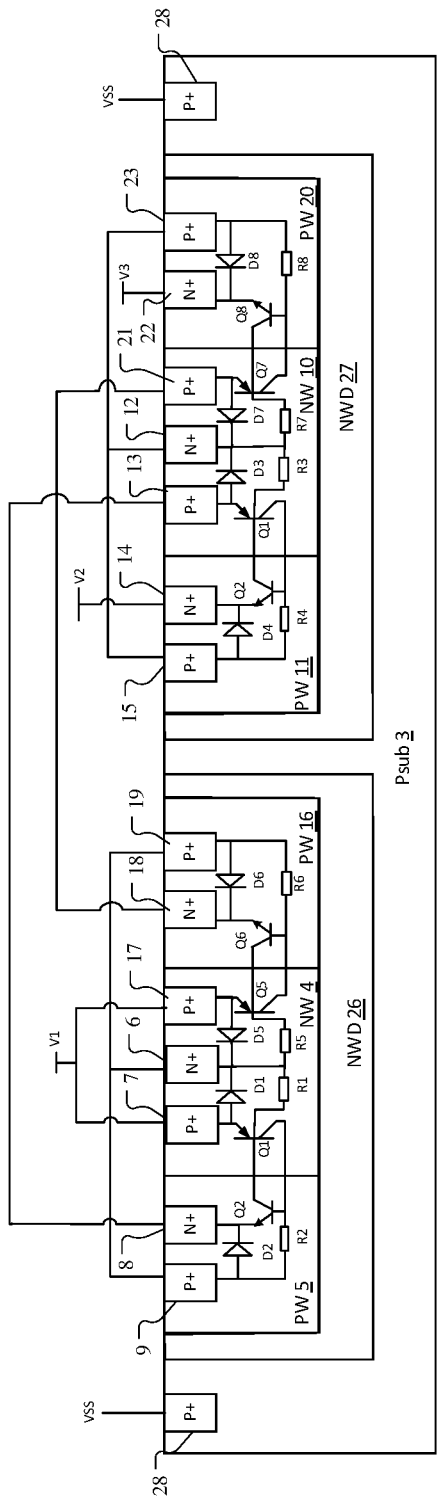
FIG. 12 is a schematic structural diagram of another exemplary embodiment of an ESD protection structure according to the present disclosure.

In this exemplary embodiment, FIG. 12 is a schematic structural diagram of another exemplary embodiment of an ESD protection structure according to the present disclosure. The ESD protection structure may further include a first N-type deep well 26. The first N-type deep well 26 is formed in the semiconductor substrate 3. The first N-type deep well 26 is a groove structure. The first N-type well 4, the first P-type well 5, and the third P-type well 16 are located in a groove formed by the first N-type deep well 26. The ESD protection structure may further include a second N-type deep well 27. The second N-type deep well 27 is formed in the semiconductor substrate. The second N-type deep well 27 is a groove structure. The second N-type well 10, the second P-type well 11, and the fourth P-type well 20 are located in a groove formed by the second N-type deep well 27. The first N-type deep well 26 can shield noise for a component in the first N-type well 4, the first P-type well 5, and the third P-type well 16, and can prevent electric leakage from the component to the P-type semiconductor substrate. Similarly, the second N-type deep well 27 can shield noise for a component in the second N-type well 10, the second P-type well 11, and the fourth P-type well 20, and can prevent electric leakage from the component to the P-type semiconductor substrate. The first N-type deep well 26 may be located in the first integrated region, and the second N-type deep well 27 may be located in the second integrated region.

In this exemplary embodiment, as shown in FIG. 12, the ESD protection structure further includes a ninth P-type doped portion 28. The ninth P-type doped portion 28 may be located in the semiconductor substrate, and located outside the first integrated region and the second integrated region. The ninth P-type doped portion 28 may be connected to a ground terminal VSS. The ninth P-type doped portion 28 may be configured to ground the semiconductor substrate 3. The ground terminal VSS may be construed as a ground terminal of a chip in which the ESD protection structure is located.

This exemplary embodiment further provides a chip, and the chip includes the ESD protection structure described above. In this exemplary embodiment, the chip includes a power terminal, a ground terminal, and a signal transmission terminal, the chip includes a plurality of ESD protection structures, and the plurality of ESD protection structures include a first ESD protection structure, a second ESD protection structure, and a third ESD protection structure. The first ESD protection structure has a first signal terminal being connected to the power terminal, a second signal terminal being connected to the signal transmission terminal, and a third signal terminal being connected to the ground terminal. The second ESD protection structure has a first signal terminal being connected to the signal transmission terminal, a second signal terminal being connected to the ground terminal, and a third signal terminal being connected to the power terminal. The third ESD protection structure has a first signal terminal being connected to the ground terminal, a second signal terminal being connected to the signal transmission terminal, and a third signal terminal being connected to the power terminal.

Figure 13:
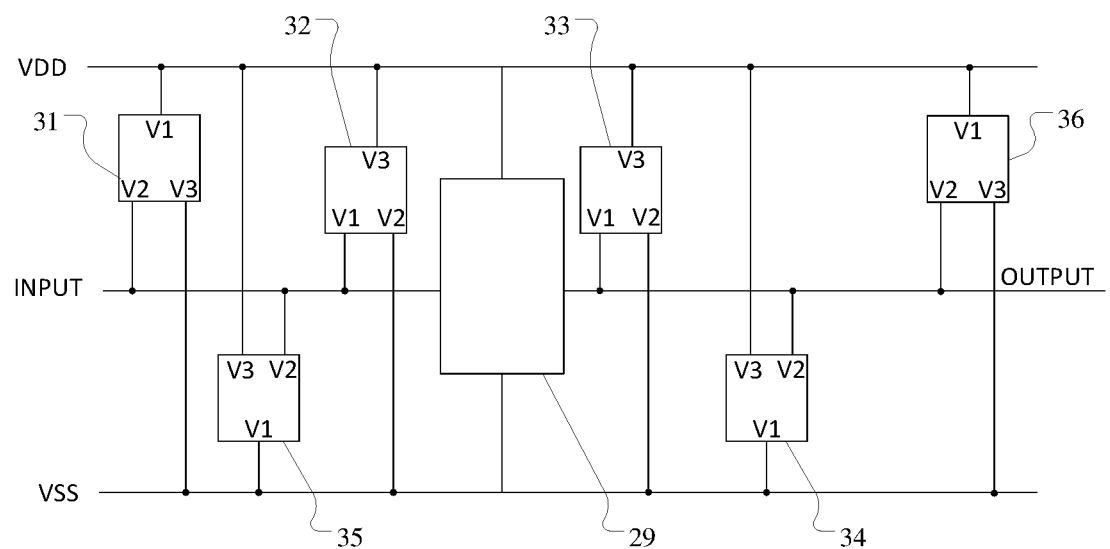
FIG. 13 is a schematic structural diagram of an exemplary embodiment of a chip according to the present disclosure.

FIG. 13 is a schematic structural diagram of an exemplary embodiment of a chip according to the present disclosure. The chip may include a core processing circuit 29, a power terminal VDD, a ground terminal VSS, a signal input terminal INPUT, and a signal output terminal OUTPUT. The chip may include five ESD protection structures shown in FIG. 12 or FIG. 8. An ESD protection structure 31 has a first signal terminal being connected to the power terminal VDD, a second signal terminal V2 being connected to the signal input terminal INPUT, and a third signal terminal V3 being connected to the ground terminal VSS. An ESD protection structure 32 has a first signal terminal being connected to the signal input terminal INPUT, a second signal terminal V2 being connected to the ground terminal VSS, and a third signal terminal V3 being connected to the power terminal VDD. An ESD protection structure 33 has a first signal terminal being connected to the signal output terminal OUTPUT, a second signal terminal V2 being connected to the ground terminal VSS, and a third signal terminal V3 being connected to the power terminal VDD. An ESD protection structure 34 has a first signal terminal being connected to the ground terminal VSS, a second signal terminal V2 being connected to the signal output terminal OUTPUT, and a third signal terminal V3 being connected to the power terminal VDD. An ESD protection structure 35 has a first signal terminal being connected to the ground terminal VSS, a second signal terminal V2 being connected to the signal input terminal INPUT, and a third signal terminal V3 being connected to the power terminal VDD. An ESD protection structure 36 has a first signal terminal being connected to the power terminal VDD, a second signal terminal V2 being connected to the output end OUTPUT, and a third signal terminal V3 being connected to the ground terminal VSS. The chip may be any chip such as a memory chip. It should be understood that, in addition to the signal input terminal and the signal output terminal, the chip may further include other signal transmission terminals.

This exemplary embodiment further provides a chip, and the chip includes the ESD protection circuit described above. In this exemplary embodiment, the chip may include a power terminal, a ground terminal, and a signal transmission terminal, the chip includes a plurality of ESD protection circuits, and the plurality of ESD protection circuits include a first ESD protection circuit, a second ESD protection circuit, and a third ESD protection circuit. The first ESD protection circuit has a first signal terminal being connected to the power terminal, a second signal terminal being connected to the signal transmission terminal, and a third signal terminal being connected to the ground terminal. The second ESD protection circuit has a first signal terminal being connected to the signal transmission terminal, a second signal terminal being connected to the ground terminal, and a third signal terminal being connected to the power terminal. The third ESD protection circuit has a first signal terminal being connected to the ground terminal, a second signal terminal being connected to the signal transmission terminal, and a third signal terminal being connected to the power terminal. Specifically, the chip may include six ESD protection circuits shown in FIG. 3. A manner in which the six ESD protection circuits are connected in the chip is the same as the manner in which the ESD protection structures in FIG. 13 are connected. Details are not described herein again.

Those skilled in the art can readily figure out other embodiments of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. An electrostatic discharge protection structure, comprising:
   a semiconductor substrate, comprising a first integrated region;
   a first N-type well, located in the first integrated region;
   a first P-type well, located in the first integrated region, and arranged adjacent to the first N-type well;
   a first N-type doped portion, located in the first N-type well;
   a first P-type doped portion, located in the first N-type well, and located on a side of the first N-type doped portion close to the first P-type well;
   a second N-type doped portion, located in the first P-type well; and
   a second P-type doped portion, located in the first P-type well, and located on a side of the second N-type doped portion away from the first N-type well, wherein
   the first N-type doped portion is electrically connected to the second P-type doped portion;
   wherein the semiconductor substrate further comprises a second integrated region, the first integrated region and the second integrated region are arranged at interval, and the electrostatic discharge protection structure further comprises:
   a second N-type well, located in the second integrated region;
   a second P-type well, located in the second integrated region, and arranged adjacent to the second N-type well;
   a third N-type doped portion, located in the second N-type well;
   a third P-type doped portion, located in the second N-type well, and located on a side of the third N-type doped portion close to the second P-type well;
   a fourth N-type doped portion, located in the second P-type well; and
   a fourth P-type doped portion, located in the second P-type well, and located on a side of the fourth N-type doped portion away from the second N-type well, wherein
   the third N-type doped portion is electrically connected to the fourth P-type doped portion, and the second N-type doped portion is electrically connected to the third P-type doped portion;
   wherein the electrostatic discharge protection structure further comprises:
   a third P-type well, located in the first integrated region, and located on a side of the first N-type well away from the first P-type well, wherein the third P-type well is arranged adjacent to the first N-type well;
   a fifth P-type doped portion, located in the first N-type well, and located on a side of the first N-type doped portion away from the first P-type doped portion;
   a fifth N-type doped portion, located in the third P-type well; and a sixth P-type doped portion, located in the third P-type well, and located on a side of the fifth N-type doped portion away from the first N-type well, wherein
   the first N-type doped portion is electrically connected to the sixth P-type doped portion.

2. The electrostatic discharge protection structure according to claim 1, wherein the electrostatic discharge protection structure further comprises:
   a fourth P-type well, located in the second integrated region, and located on a side of the second N-type well away from the second P-type well, wherein the fourth P-type well is arranged adjacent to the second N-type well;
   a seventh P-type doped portion, located in the second N-type well, and located on a side of the third N-type doped portion away from the third P-type doped portion;
   a sixth N-type doped portion, located in the fourth P-type well; and
   an eighth P-type doped portion, located in the fourth P-type well, and located on a side of the sixth N-type doped portion away from the second N-type well, wherein
   the third N-type doped portion is electrically connected to the eighth P-type doped portion, and the fifth N-type doped portion is electrically connected to the seventh P-type doped portion.

3. The electrostatic discharge protection structure according to claim 2, wherein the semiconductor substrate is a P-type semiconductor substrate.

4. The electrostatic discharge protection structure according to claim 3, wherein the electrostatic discharge protection structure further comprises:
   a first N-type deep well, formed in the semiconductor substrate; wherein the first N-type deep well is a groove structure; the first N-type well, the first P-type well, and the third P-type well are located in a groove formed by the first N-type deep well.

5. The electrostatic discharge protection structure according to claim 3, wherein the electrostatic discharge protection structure further comprises:
   a second N-type deep well, formed in the semiconductor substrate; wherein the second N-type deep well is a groove structure; the second N-type well, the second P-type well, and the fourth P-type well are located in a groove formed by the second N-type deep well.

6. The electrostatic discharge protection structure according to claim 3, wherein the electrostatic discharge protection structure further comprises:
   a ninth P-type doped portion, located in the semiconductor substrate, and located outside the first integrated region and the second integrated region, wherein
   the ninth P-type doped portion is connected to a ground terminal.

7. The electrostatic discharge protection structure according to claim 2, wherein the electrostatic discharge protection structure further comprises a first signal terminal, a second signal terminal, and a third signal terminal; the first P-type doped portion and the fifth P-type doped portion are configured to connect to the first signal terminal of the electrostatic discharge protection structure, the fourth N-type doped portion is configured to connect to the second signal terminal of the electrostatic discharge protection structure, and the sixth N-type doped portion is configured to connect to the third signal terminal of the electrostatic discharge protection structure.

8. An electrostatic discharge protection circuit, comprising at least one electrostatic discharge protection unit; wherein the electrostatic discharge protection unit comprises a thyristor, a first diode, and a second diode;
   the thyristor comprises:
     a PNP-type triode, having an emitter forming an anode of the thyristor, a base being connected to a first node, and a collector being connected to a second node; and
     an NPN-type triode, having a collector being connected to the first node, a base being connected to the first node and the second node, and an emitter forming a cathode of the thyristor;
   an anode of the first diode is connected to the anode of the thyristor, and a cathode of the first diode is connected to the first node;
   an anode of the second diode is connected to the first node, and a cathode of the second diode is connected to the cathode of the thyristor;
   wherein the anode of the thyristor in the electrostatic discharge protection circuit forms an anode of the electrostatic discharge protection unit, and the cathode of the thyristor in the electrostatic discharge protection circuit forms a cathode of the electrostatic discharge protection unit; and
   the electrostatic discharge protection circuit comprises a plurality of electrostatic discharge protection units, the plurality of electrostatic discharge protection units are connected in series; and in two adjacent electrostatic discharge protection units, an anode of one electrostatic discharge protection unit is connected to a cathode of the other electrostatic discharge protection unit;
   wherein the electrostatic discharge protection circuit comprises:
     a first signal terminal, a second signal terminal, a third signal terminal, a first electrostatic discharge protection unit group, and a second electrostatic discharge protection unit group; wherein
   the first electrostatic discharge protection unit group, comprises:
     a first electrostatic discharge protection unit, having an anode being connected to the first signal terminal; and
     a second electrostatic discharge protection unit, having an anode being connected to a cathode of the first electrostatic discharge protection unit, and a cathode being connected to the second signal terminal;
   the second electrostatic discharge protection unit group, comprises:
     a third electrostatic discharge protection unit, having an anode being connected to the first signal terminal; and
     a fourth electrostatic discharge protection unit, having an anode being connected to a cathode of the third electrostatic discharge protection unit, and a cathode being connected to the third signal terminal;
   wherein, the first electrostatic discharge protection unit, the second electrostatic discharge protection unit, the third electrostatic discharge protection unit, and the fourth electrostatic discharge protection unit form the plurality of electrostatic discharge protection units.

9. A chip, comprising the electrostatic discharge protection circuit according to claim 8.

10. The chip according to claim 9, wherein the chip comprises a power terminal, a ground terminal, and a signal transmission terminal; the chip comprises a plurality of electrostatic discharge protection circuits;
   when the electrostatic discharge protection circuit comprises a first signal terminal, a second signal terminal, and a third signal terminal, the plurality of electrostatic discharge protection circuits comprise:
     a first electrostatic discharge protection circuit, wherein a first signal terminal of the first electrostatic discharge protection circuit is connected to the power terminal, a second signal terminal of the first electrostatic discharge protection circuit is connected to the signal transmission terminal, and a third signal terminal of the first electrostatic discharge protection circuit is connected to the ground terminal;
     a second electrostatic discharge protection circuit, wherein a first signal terminal of the second electrostatic discharge protection circuit is connected to the signal transmission terminal, a second signal terminal of the second electrostatic discharge protection circuit is connected to the ground terminal, and a third signal terminal of the second electrostatic discharge protection circuit is connected to the power terminal; and
     a third electrostatic discharge protection circuit, wherein a first signal terminal of the third electrostatic discharge protection circuit is connected to the ground terminal, a second signal terminal of the third electrostatic discharge protection circuit is connected to the signal transmission terminal, and a third signal terminal of the third electrostatic discharge protection circuit is connected to the power terminal.

11. A chip, comprising the electrostatic discharge protection structure according to claim 1.

12. A chip, comprising an electrostatic discharge protection structure, comprising:
   a semiconductor substrate, comprising a first integrated region;
   a first N-type well, located in the first integrated region;
   a first P-type well, located in the first integrated region, and arranged adjacent to the first N-type well;
   a first N-type doped portion, located in the first N-type well;
   a first P-type doped portion, located in the first N-type well, and located on a side of the first N-type doped portion close to the first P-type well;
   a second N-type doped portion, located in the first P-type well; and
   a second P-type doped portion, located in the first P-type well, and located on a side of the second N-type doped portion away from the first N-type well, wherein
   the first N-type doped portion is electrically connected to the second P-type doped portion;
   wherein the chip comprises a power terminal, a ground terminal, and a signal transmission terminal; the chip comprises a plurality of electrostatic discharge protection structures;
   when the electrostatic discharge protection structure comprises a first signal terminal, a second signal terminal, and a third signal terminal, the plurality of electrostatic discharge protection structures comprise:
     a first electrostatic discharge protection structure, wherein a first signal terminal of the first electrostatic discharge protection structure is connected to the power terminal, a second signal terminal of the first electrostatic discharge protection structure is connected to the signal transmission terminal, and a third signal terminal of the first electrostatic discharge protection structure is connected to the ground terminal;
     a second electrostatic discharge protection structure, wherein a first signal terminal of the second electrostatic discharge protection structure is connected to the signal transmission terminal, a second signal terminal of the second electrostatic discharge protection structure is connected to the ground terminal, and a third signal terminal of the second electrostatic discharge protection structure is connected to the power terminal; and
a third electrostatic discharge protection structure, wherein a first signal terminal of the third electrostatic discharge protection structure is connected to the ground terminal, a second signal terminal of the third electrostatic discharge protection structure is connected to the signal transmission terminal, and a third signal terminal of the third electrostatic discharge protection structure is connected to the power terminal.

* * * * *